(12) United States Patent
Matsui et al.

(10) Patent No.: US 12,743,016 B2
(45) Date of Patent: Sep. 22, 2026

(54) REFLECTIVE MASK BLANK, REFLECTIVE MASK, REFLECTIVE MASK MANUFACTURING METHOD, AND REFLECTIVE MASK CORRECTION METHOD

(71) Applicant: TEKSCEND PHOTOMASK CORP., Tokyo (JP)

(72) Inventors: Kazuaki Matsui, Tokyo (JP); Yosuke Kojima, Tokyo (JP)

(73) Assignee: TEKSCEND PHOTOMASK CORP., Tokyo (JP)

( * ) Notice: Subject to any disclaimer, the term of this patent is extended or adjusted under 35 U.S.C. 154(b) by 811 days.

(21) Appl. No.: 17/784,209

(22) PCT Filed: Dec. 10, 2020

(86) PCT No.: PCT/JP2020/046082

§ 371 (c)(1), (2) Date: Jun. 10, 2022

(87) PCT Pub. No.: WO2021/125048

PCT Pub. Date: Jun. 24, 2021

(65) Prior Publication Data

US 2023/0070724 A1 Mar. 9, 2023

(30) Foreign Application Priority Data

Dec. 18, 2019 (JP) ................................ 2019-228507

(51) Int. Cl.
*G03F 1/24* (2012.01)

(52) U.S. Cl.
CPC ..................................... *G03F 1/24* (2013.01)

(58) Field of Classification Search
CPC .................................... G03F 1/22; G03F 1/24
See application file for complete search history.

(56) References Cited

U.S. PATENT DOCUMENTS 6,753,538 B2 6/2004 Musil et al.
8,288,062 B2 10/2012 Hayashi et al.
(Continued)

FOREIGN PATENT DOCUMENTS

EP 3454120 A1 * 3/2019 .............. G03F 1/22
JP 2001-237174 A 8/2001
(Continued)

OTHER PUBLICATIONS

International Search Report mailed Mar. 2, 2021 for International Application No. PCT/JP2020/046082, with translation, 6 pages.
(Continued)

*Primary Examiner* — Martin J Angebranndt
(74) *Attorney, Agent, or Firm* — Squire Patton Boggs (US) LLP

(57) ABSTRACT

There are provided a reflective mask blank, a reflective mask, a reflective mask manufacturing method, and a reflective mask correction technique capable of reducing time required for electron beam correction etching, even when a material used for a thin absorption film has a large extinction coefficient k to an EUV light. A reflective photomask blank (10) according to this embodiment has a substrate (1), a multi-layer reflective film (2), a capping layer (3), and a low reflective portion (5), in which the low reflective portion (5) is obtained by alternately depositing an absorption film (A) and an absorption film (B), the correction etching rate in the electron beam correction of the absorption film (A) is larger than the correction etching rate in the electron beam correction of the absorption film (B), and the absorption film (B) contains one or more elements selected from tin, indium, platinum, nickel, tellurium, silver, and cobalt.

10 Claims, 10 Drawing Sheets

(56) References Cited

U.S. PATENT DOCUMENTS

2003/0047691 A1 3/2003 Musil et al.
2005/0084768 A1* 4/2005 Han ........................ G21K 1/062 430/323
2009/0191469 A1* 7/2009 Charpin-Nicolle .... B82Y 40/00 430/5
2009/0226825 A1* 9/2009 Hagiwara ................ G03F 1/80 430/5
2010/0167181 A1* 7/2010 Kim ........................ G03F 1/24 430/5
2012/0021344 A1* 1/2012 Matsuo .................. B82Y 10/00 430/5
2012/0107733 A1 5/2012 Hayashi et al.
2014/0038086 A1* 2/2014 Shih ........................ G03F 1/24 430/5
2015/0212402 A1* 7/2015 Patil ........................ G03F 1/24 430/5
2016/0011500 A1* 1/2016 Hassan .................. C23C 16/44 430/5
2018/0031964 A1* 2/2018 Jindal ...................... G03F 1/24
2019/0113836 A1* 4/2019 Sun ......................... G03F 1/80
2020/0096875 A1* 3/2020 Van De Kerkhof ......................... G03F 7/70316
2020/0159106 A1* 5/2020 Fukugami ................ G03F 1/22
2020/0218143 A1* 7/2020 Komizo .................. G03F 1/54
2020/0249557 A1* 8/2020 Liu ......................... G03F 1/22
2020/0278603 A1* 9/2020 Xiao ........................ G03F 1/48
2021/0373430 A1* 12/2021 Tsai ......................... G03F 1/54
2023/0143851 A1* 5/2023 Goda ....................... G03F 1/24 430/5
2023/0176467 A1* 6/2023 Ichikawa ................. G03F 1/54 430/5
2023/0375908 A1* 11/2023 Matsui ..................... G03F 1/60

FOREIGN PATENT DOCUMENTS

JP 2004-537758 A 12/2004
JP 2007250613 A * 9/2007
JP 2007-273678 A 10/2007
JP 2007273656 A * 10/2007
JP 2008041740 A * 2/2008
JP 2009054899 A * 3/2009
JP 2010045317 A * 2/2010
JP 2010-103463 A 5/2010
JP 2010118520 A * 5/2010
JP 2011-238801 A 11/2011
JP 2015-008283 A 1/2015
JP 2015125166 A * 7/2015
JP 6408790 B2 10/2018
JP 2019049720 A * 3/2019
KR 2015105059 A * 9/2015 .............. G03F 1/22
KR 20150105059 A * 9/2015 .............. G03F 1/22
KR 2019033444 A * 3/2019 .............. G03F 1/24
KR 2019086195 A * 7/2019 .............. G03F 1/24
WO WO 2011/004850 A1 1/2011
WO WO-2020100632 A1 * 5/2020 .............. G03F 1/24
WO WO-2020241780 A1 * 12/2020 .............. G03F 1/54

OTHER PUBLICATIONS

International Preliminary Report on Patentability mailed Jun. 30, 2022 for International Application No. PCT/JP2020/046082, 6 pages.

* cited by examiner

FIG. 3

REFRACTIVE INDEX n

EXTINCTION COEFFICIENT k

REFLECTIVE MASK BLANK, REFLECTIVE MASK, REFLECTIVE MASK MANUFACTURING METHOD, AND REFLECTIVE MASK CORRECTION METHOD

CROSS-REFERENCE

This application is a National Stage filing under 35 U.S.C. § 371 of International Patent Application No. PCT/JP2020/046082, filed Dec. 10, 2020, which claims the benefit of and priority to Japanese Patent Application No. 2019-228507, filed Dec. 18, 2019, the contents of all of which are hereby incorporated by reference in their entireties for all purposes.

TECHNICAL FIELD

The present invention relates to a reflective mask blank, a reflective mask, a reflective mask manufacturing method, and a reflective mask correction method.

BACKGROUND ART

In a manufacturing process for semiconductor devices, a demand for miniaturization by a photolithography technology has increased with the miniaturization of the semiconductor devices. In the photolithography, the minimum resolution dimension of a transfer pattern largely depends on the wavelength of an exposure light source, and the minimum resolution dimension can be made smaller as the wavelength is shorter. Therefore, in the manufacturing process for semiconductor devices, a conventional exposure light source using an ArF excimer laser light having a wavelength of 193 nm has been replaced with an EUV exposure light source having a wavelength of 13.5 nm.

Since an EUV light has a short wavelength, most substances have high light absorptivity. Therefore, a mask for the EUV (EUV mask) is a reflective photomask unlike a conventional transmissive mask (see PTL 1, PTL 2, for example). PTL 1 discloses, in a reflective exposure mask used for EUV lithography, forming a multi-layer film in which two or more kinds of material layers are periodically deposited on a base substrate and forming, on the multi-layer film, a pattern containing a nitrogen-containing metal film or a mask pattern containing a multi-layer structure of a metal nitride film and a metal film. PTL 2 discloses a reflective EUV mask including a phase control film and a multi-layer structure in which a high refractive index material layer and a low refractive index material layer are alternately deposited on the phase control film as an absorber layer on a multi-layer reflective film.

PTL 1 describes that, when the optical density (OD) is 1.5 or more, a light intensity contrast enabling pattern transfer can be obtained. PTL 2 describes that, when the reflectance from the absorber layer is 2% or less to an incident light, a light intensity contrast enabling pattern transfer can be obtained.

Further, in the EUV lithography, a dioptric system utilizing light transmission cannot be used as described above, and therefore an optical system member of an exposure machine is not a lens but a mirror. This poses a problem that an incident light and a reflected light on an EUV photomask cannot be coaxially designed. In general, the EUV lithography uses a technique of making the EUV light incident by tilting the optical axis by 6° from the vertical direction of the EUV mask and guiding a reflected light reflected at an angle of −6° to a semiconductor substrate.

As described above, the optical axis is tilted in the EUV lithography, which has sometimes posed a problem referred to as a so-called "shadowing effect" in which the EUV light incident on the EUV mask creates a shadow of a pattern of the EUV mask (absorption layer pattern), resulting in a deterioration of the transfer performance.

To address this problem, PTL 2 discloses a method capable of reducing the shadowing effect by enabling a reduction in the film thickness (60 nm or less) of the absorber layer than before by the use of a material having an extinction coefficient k of 0.03 or more to the EUV as the phase control film and the low refractive index material layer.

PTL 3 discloses a method for reducing the shadowing effect by reducing the thickness of each film by the use of a compound material having higher absorptivity (extinction coefficient k) to the EUV light for a conventional absorption film or phase shift film containing tantalum as a main component.

However, the materials having a high extinction coefficient k to the EUV light described in PTL 2 and PTL 3 have an extremely low etching rate as compared with the etching rate of the conventional absorption film containing tantalum as the main component when electron beam correction etching is performed in a defect correction step of a photomask production step. Therefore, it is sometimes difficult to correct defects in an EUV mask containing the materials having a high extinction coefficient k to the EUV light. More specifically, the EUV mask formed using the materials having a high extinction coefficient k to the EUV light can reduce the shadowing effect, but sometimes requires time for the electron beam correction etching in the defect correction step of the photomask production step.

CITATION LIST

Patent Literature

PTL 1: JP 2001-237174 A
PTL 2: JP 6408790 B2
PTL 3: WO 11/004850

SUMMARY OF INVENTION

Technical Problem

Thus, it is an object of the present invention to provide a reflective mask blank, a reflective mask, a reflective mask manufacturing method, and a reflective mask correction technique capable of reducing the time required for the electron beam correction etching, even when a material used for a thin absorption film has a large extinction coefficient k to the EUV light.

Solution to Problem

In order to solve the above-described problems, a reflective mask blank according to one aspect of present invention has: a substrate; a reflective film having a multi-layer film structure formed on the substrate and configured to reflect an EUV light; a protective film formed on the reflective film and configured to protect the reflective film; and an absorption film containing a multi-layer film containing two or more layers formed on the protective film and configured to absorb the EUV light, in which the absorption film is obtained by alternately depositing a first absorption film and a second absorption film, the correction etching rate in electron beam correction of the first absorption film is larger than the correction etching rate in electron beam correction of the second absorption film, and the second absorption film contains one or more elements selected from tin, indium, platinum, nickel, tellurium, silver, and cobalt.

A reflective mask according to one aspect of present invention has: a substrate; a reflective film having a multi-layer film structure formed on the substrate and configured to reflect an EUV light; a protective film formed on the reflective film and configured to protect the reflective film; and an absorption film containing a multi-layer film containing two or more layers formed on the protective film and configured to absorb the EUV light, in which a transfer pattern is formed on the absorption film, the absorption film is obtained by alternately depositing a first absorption film and a second absorption film, the correction etching rate in electron beam correction of the first absorption film is larger than the correction etching rate in electron beam correction of the second absorption film, and the second absorption film contains one or more elements selected from tin, indium, platinum, nickel, tellurium, silver, and cobalt.

A reflective mask manufacturing method according to one aspect of present invention is a method for manufacturing the reflective mask described above, and the method includes: performing electron beam correction etching of the first absorption film; and performing electron beam correction etching of the second absorption film, in which, in the performing of the electron beam correction etching of the first absorption film, an etching resistant film is formed on the side surface of the second absorption film when the first absorption film is subjected to the electron beam correction etching, and, in the performing of the electron beam correction etching of the second absorption film, the electron beam correction etching of the second absorption film is performed such that the side etching amount is 5 nm or less.

A reflective mask correction method according to one aspect of present invention is a correction method for the reflective mask described above by electron beam correction etching, and the method includes: performing electron beam correction of the first absorption film with an oxygen-containing etching gas; and performing electron beam correction of the second absorption film with an oxygen-free etching gas.

Advantageous Effects of Invention

One aspect of the present invention can provide a reflective mask blank, a reflective mask, a reflective mask manufacturing method, and a reflective mask correction technique capable of reducing the time required for the electron beam correction etching even when the material used for the thin absorption film has a large extinction coefficient k to the EUV light. Specifically, according to one aspect of present invention, the second absorption film contains a material which has a large extinction coefficient k to the EUV light and can be expected to reduce the thickness of the absorption film but is difficult to be subjected to the electron beam correction etching in the case of a single layer and the first absorption film which has a smaller extinction coefficient k to the EUV light than that of the material constituting the second absorption film but which is easy to be subjected to the electron beam correction etching are used in combination to form a multi-layer, and the optimum correction etching conditions are used for each absorption film, and thus side etching, which causes film damage to the second absorption film, can be suppressed, and the electron beam correction etching is enabled.

BRIEF DESCRIPTION OF DRAWINGS

FIG. 3 is a graph showing the optical constants of each metal at the wavelength of an EUV light;

DESCRIPTION OF EMBODIMENTS

Hereinafter, the configurations of a reflective photomask blank (reflective mask blank) and a reflective photomask (reflective mask) according to the present invention are described with reference to the drawings.

Figure 1:
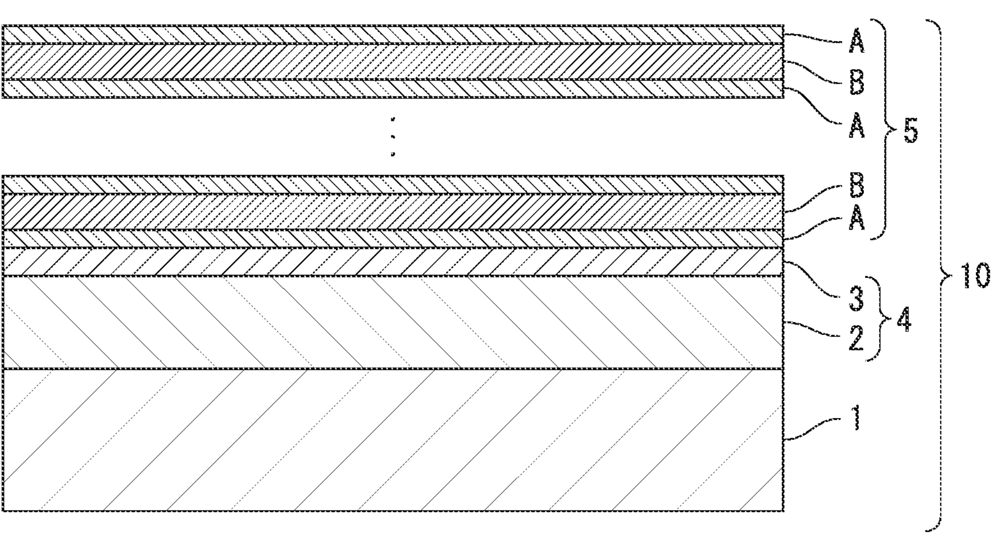
FIG. 1 is a schematic cross-sectional view illustrating the structure of a reflective photomask blank according to an embodiment of the present invention.
Figure 2:
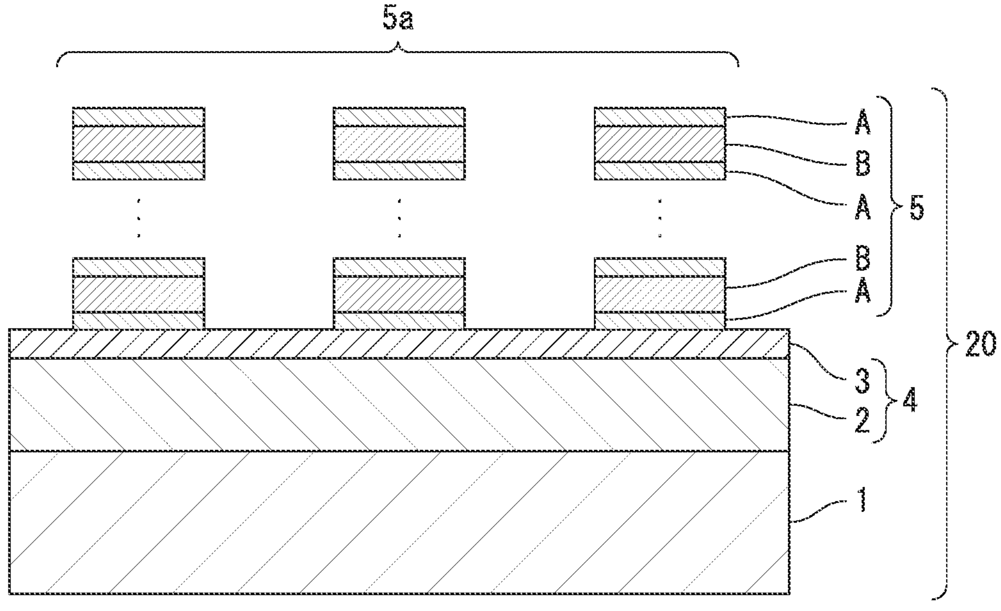
FIG. 2 is schematic cross-sectional view illustrating the structure of a reflective photomask according to the embodiment of the present invention.

FIG. 1 is a schematic cross-sectional view illustrating the structure of a reflective photomask blank 10 according to an embodiment of the present invention. FIG. 2 is a schematic cross-sectional view illustrating the structure of a reflective photomask 20 according to the embodiment of the present invention. Herein, the reflective photomask 20 according to the embodiment of the present invention illustrated in FIG. 2 is formed by patterning a low reflective portion (absorption film) 5 of the reflective photomask blank 10 according to the embodiment of the present invention illustrated in FIG. 1.

(Entire Structure)

As illustrated in FIG. 1, the reflective photomask blank 10 according to the embodiment of the present invention includes a multi-layer reflective film (reflective film) 2 on a substrate 1 and a capping layer (protective film) 3 on the multi-layer reflective film 2 in this order. Thus, a reflective portion 4 having the multi-layer reflective film 2 and the capping layer 3 is formed on the substrate 1. The low reflective portion (absorption film) 5 is provided on the reflective portion 4. The low reflective portion 5 contains at least two layers, one layer of which is an absorption layer (first absorption film) A and the other one of which is an absorption layer (second absorption film) B. A bottom portion (bottom layer) and the outermost surface layer (top layer) of the low reflective portion 5 each contain the absorption layer A.

(Substrate)

For the substrate 1 according to the embodiment of the present invention, a flat Si substrate, synthetic quartz substrate, or the like is usable for example. Further, a low thermal expansion glass to which titanium is added is usable for the substrate 1. However, the present invention is not limited to the above and any material having a small thermal expansion coefficient may be acceptable.

(Reflective Layer)

The multi-layer reflective film 2 according to the embodiment of the present invention may be a film reflecting an EUV light (extreme ultraviolet light), which is an exposure light, and is preferably a multi-layer reflective film containing a combination of materials having greatly different refractive indices to the EUV light. The multi-layer reflective film 2 is preferably a film formed by repeatedly depositing a layer containing a combination of Mo (molybdenum) and Si (silicon) or Mo (molybdenum) and Be (beryllium) by about 40 cycles, for example.

(Capping Layer)

The capping layer 3 according to the embodiment of the present invention is formed of a material resistant to dry etching performed in forming a pattern of the absorption layer A and functions as an etching stopper to prevent damage to the multi-layer reflective film 2 in forming a low reflective portion pattern (transfer pattern) **5*a* described later by etching. Herein, the capping layer 3 may not be provided depending on materials of the multi-layer reflective film 2 and the etching conditions. Although not illustrated in the drawings, a back surface conductive film can be formed on the surface on which the multi-layer reflective film 2 is not formed of the substrate 1. The back surface conductive film is a film for fixing a reflective photomask 20 described later utilizing the principle of an electrostatic chuck when the reflective photomask 20** is installed in an exposure machine.

(Low Reflective Portion)

As illustrated in FIG. 2, the low reflective portion 5 according to the embodiment of the present invention is a layer in which the low reflective portion pattern **5*a* is formed by removing a part of the low reflective portion 5 of the reflective photomask blank 10**.

The total thickness of the low reflective portion 5 is preferably 60 nm or less. When the total thickness of the low reflective portion 5 is 60 nm or less, a shadowing effect can be effectively reduced.

The film thickness of the absorption film A constituting the low reflective portion 5 is preferably within the range of 0.5 nm or more and 6 nm or less, more preferably within the range of 1 nm or more and 3 nm or less, and still more preferably within the range of 1.8 nm or more and 2.2 nm or less. When the film thickness of the absorption film A constituting the low reflective portion 5 is within the range of the numerical values above, a time required for electron beam correction etching in a defect correction step of a photomask production step can be effectively reduced.

The film thickness of the absorption film B constituting the low reflective portion 5 is preferably 35 nm or less. When the film thickness of the absorption film B constituting the low reflective portion 5 is equal to or less than the numerical value above, the shadowing effect can be further reduced.

The outermost surface layer of the low reflective portion 5 is preferably the absorption film A. When the outermost surface layer of the low reflective portion 5 is the absorption film A, the surface roughness Ra of the reflective photomask blank 10 can be made small. Specifically, the surface roughness Ra of the reflective photomask blank 10 can be set to about 0.3 nm. When the absorption film A is not provided, i.e., when the absorption film B is the outermost surface layer, the surface roughness Ra of the reflective photomask blank 10 is about 1.0 nm.

At least one of the absorption film A and the absorption film B may contain one or more types selected from nitrogen, oxygen, and carbon. When at least one of the absorption film A and the absorption film B contains one or more types selected from nitrogen, oxygen and carbon, the time required for the electron beam correction etching in the defect correction step of the photomask production step can be effectively shortened.

In EUV lithography, the EUV light is obliquely incident and reflected by the reflective portion 4, but the transfer performance onto a wafer (semiconductor substrate) sometimes deteriorates due to the shadowing effect in which the low reflective portion pattern **5*a* interferes with an optical path. This deterioration of the transfer performance is reduced by reducing the thickness of the low reflective portion 5 absorbing the EUV light. To reduce the thickness of the low reflective portion 5**, it is preferable to apply, to the absorption layer B, a material having higher absorptivity to the EUV light than that of a conventional material, i.e., a material having a high extinction coefficient k to a wavelength of 13.5 nm.

Figure 3:
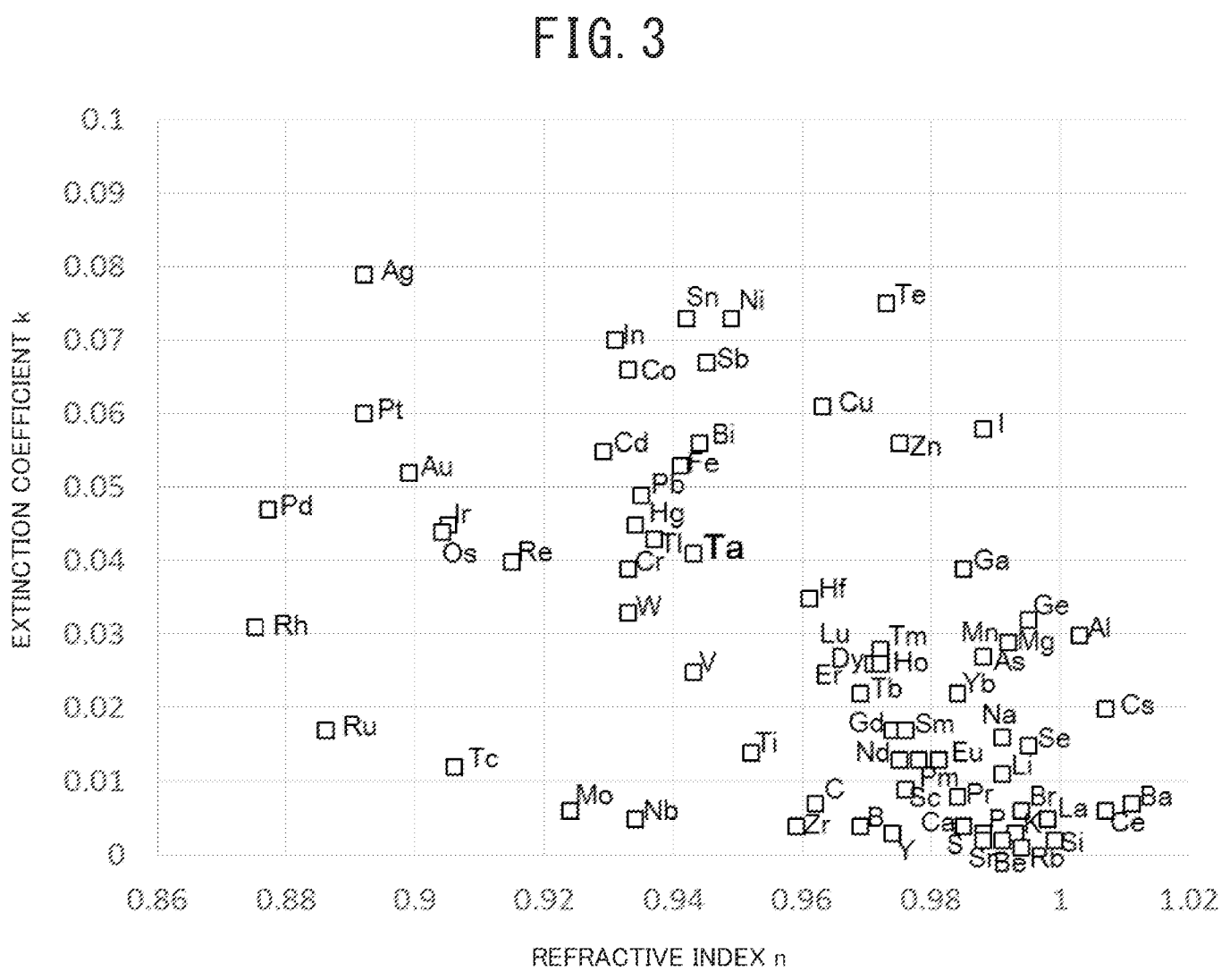

FIG. 3 is a graph showing the optical constants to the wavelength of 13.5 nm of the EUV light of each metal material. The horizontal axis of FIG. 3 represents the refractive index n and the vertical axis represents the extinction coefficient k. The extinction coefficient k of tantalum (Ta), which is a main material of the conventional absorption layer, is 0.041. Compound materials having a larger extinction coefficient k can reduce the thickness of the absorption layer (low reflective portion) as compared with a conventional compound material. When the extinction coefficient k is 0.06 or more, the thickness of the absorption layer B can be sufficiently reduced and the shadowing effect can be reduced.

As compound materials of the absorption layer B satisfying a combination of the optical constants (nk value) described above, materials containing one or more elements elected from silver (Ag), platinum (Pt), indium (In), cobalt (Co), tin (Sn), nickel (Ni), and tellurium (Te) are mentioned as illustrated in FIG. 3. Specifically, when the material of the absorption layer B is tin oxide (SnO), materials having an atomic number ratio between tin (Sn) and oxygen (O) within the range of 25:75 to 50:50 are preferable. When the material of the absorption layer B is indium oxide (InO), materials having an atomic number ratio between indium (In) and oxygen (O) within the range of 35:65 to 70:30 are preferable. When the material of the absorption layer B is tantalum tin oxide (SnOTa), materials having atomic number ratio of tin (Sn), oxygen (O), and tantalum (Ta) within the range of 10:30:60 to 40:40:20 are preferable. When the atomic number ratio in the material of the absorption layer B is within the range of the numerical values above, the extinction coefficient k is large, and thus the thickness of the absorption layer (low reflective portion) can be made thinner than before.

Figure 4:
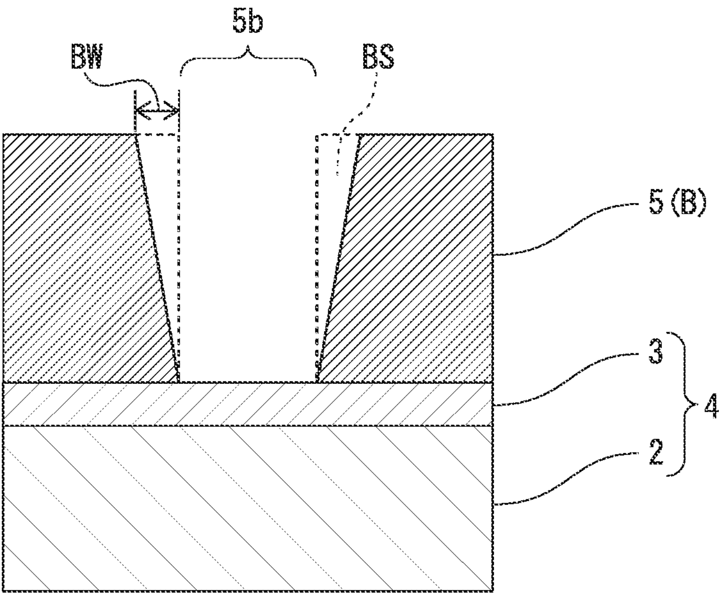
FIG. 4 is a schematic cross-sectional view illustrating side etching after electron beam correction etching of a single-layer absorption film containing tin.

FIG. 4 is a schematic cross-sectional view illustrating the shape of the low reflective portion 5 (absorption layer B) after electron beam correction etching treatment when tin (Sn) is selected from the metals having an extinction coefficient k of 0.06 or more above and the low reflective portion 5 is produced by only the absorption layer B having a single layer containing tin (Sn). In the electron beam correction etching, tin (Sn) constituting the low reflective portion 5 (absorption layer B) is etched by promoting the reactivity of a fluorine etchant by irradiating an etching target portion with an electron beam while supplying an etching gas, such as a fluorine-based gas. However, tin (Sn) and the metals above have strong etching resistance to the fluorine-based gas, and thus require an extremely long time for etching. Therefore, damage occurs in a direction perpendicular (in-plane direction of the low reflective portion 5) to the etching direction (direction from the surface side of the low reflective portion 5 toward the capping layer 3 side) referred to as side etching BS as illustrated in FIG. 4. When this side etching is large, the line width of a portion subjected to the electron beam correction etching greatly deviates from the designed line width, which is one of the causes of a correction failure.

A "side etching amount (width of side etching) BW" illustrated in FIG. 4 refers to a distance from a projection portion to a depressed portion in the in-plane direction of the absorption layer B when, on the side surface on which the low reflective portion pattern **5*a* is formed of the absorption layer B, i.e., the side surface in contact with a portion 5*b* subjected to electron beam correction etching in low reflective portion, the most projecting portion in the in-plane direction of the absorption layer B is the projection portion and the most depressed portion in the in-plane direction of the absorption layer B is the depressed portion. In FIG. 4, the projection portion corresponds to a portion in contact with the capping layer 3** of the absorption layer B and the depressed portion corresponds to a surface portion of the absorption layer B. The side etching amount BW according to the embodiment of the present invention is preferably 5 nm or less. When the side etching amount BW is 5 nm or less, the deterioration of the transfer performance can be reduced.

Figure 5:
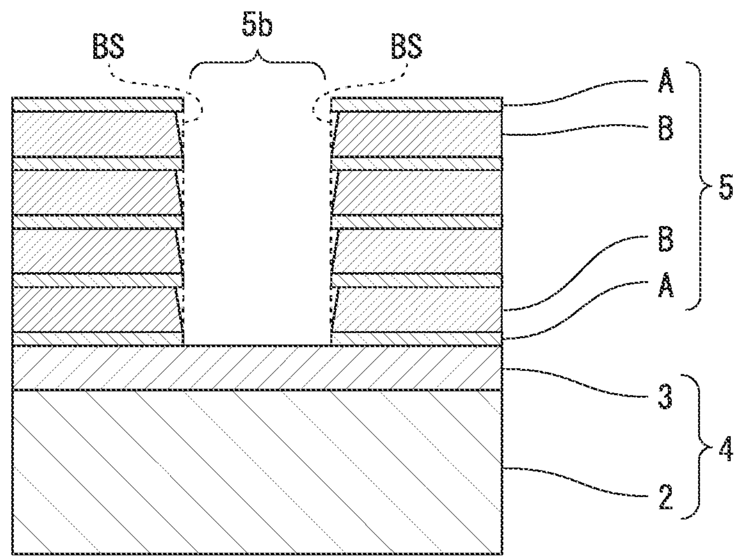
FIG. 5 is a schematic cross-sectional view illustrating side etching after electron beam correction etching of a multi-layer absorption film of the reflective photomask according to the embodiment of the present invention.

In this embodiment, by the use of the low reflective portion 5 including the multi-layer absorption film in which the absorption layer A having a higher electron beam correction etching rate than that of the absorption layer B and the absorption layer B having a larger extinction coefficient k and having a lower electron beam correction etching rate than those of the material constituting the absorption layer A are alternately deposited, the side etching BS can be suppressed as illustrated in FIG. 5, and the success rate of the electron beam correction etching can be improved.

Hereinafter, a detailed mechanism is described with reference to FIG. 6 in which a part of the low reflective portion 5 including the multi-layer absorption layer is enlarged.

Figure 6:
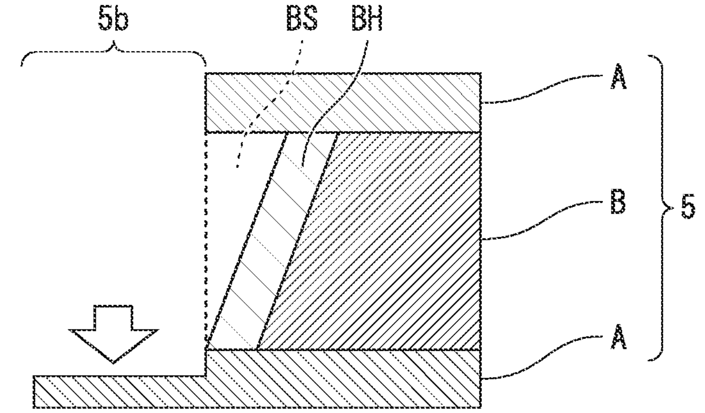
FIG. 6 is a schematic enlarged cross-sectional view illustrating side etching during the electron beam correction etching of the multi-layer absorption film of the reflective photomask according to the embodiment of the present invention.

FIG. 6 is a view illustrating the absorption layer A during the electron beam correction etching, and a BH is a protective layer (etching resistant film) formed on the side surface of the absorption layer B. When the low reflective portion 5 including the multi-layer absorption layer of this embodiment is subjected to the electron beam correction etching, a multi-stage etching process is preferably used in which an etching gas is switched between the absorption layer A and the absorption layer B. When etching the absorption layer B, the etching is preferably performed using the fluorine-based gas as described above. When etching the absorption layer A, the etching is preferably performed using a gas in which oxygen is mixed with the fluorine-based gas. More specifically, when etching the absorption layer B, the etching is preferably performed using an oxygen-free fluorine-based gas and, when etching the absorption layer A, the etching is preferably performed using an oxygen-containing fluorine-based gas. Since the oxygen mixed gas does not act as the etching gas but acts as a deposition gas for the absorption layer B, a possibility of etching the absorption layer B is extremely low, and the protective layer BH is formed on the side surface of the absorption layer B. Therefore, the repeated use of the above-described multi-stage etching process for the low reflective portion 5 enables the electron beam correction etching in which the occurrence of the side etching BS is suppressed as illustrated in FIG. 5.

The amount of the oxygen contained in the fluorine-based gas when etching the absorption layer A is preferably within the range 5% or more and 50% or less based on the total amount of the fluorine-based gas. When the amount of the oxygen contained in the fluorine-base gas when etching absorption layer A is within the range of the numerical values above, the absorption layer A can be efficiently etched and the protective layer BH can be efficiently formed on the side surface of the absorption layer B.

Herein, the "oxygen-free fluorine-based gas" used when etching the absorption layer B means that oxygen is not added to the fluorine-based gas and may be a gas containing oxygen in the proportion of about 1% or within the range of 1% or less based on the total amount of the fluorine-based gas.

In this embodiment, the correction etching rate when only the absorption film A is subjected to the electron beam correction may be within the range of 20 times or more and 100 times or less, more preferably within the range is 40 times or more and 80 times or less, and still more preferably within the range 50 times or more and 70 times or less the correction etching rate when only the absorption film B is subjected to the electron beam correction. In a case where the correction etching rate when only the absorption film A is subjected to the electron beam correction is within the range of the numerical values above, the time required for the electron beam correction can be effectively shortened as compared with that in a prior art.

In this embodiment, the correction etching rate when only the absorption film B is subjected to the electron beam correction is preferably 1 nm/min or more, more preferably 1.4 nm/min or more, and still more preferably 1.6 nm/min or more, for example. In a case where the correction etching rate when only the absorption film B is subjected to the electron beam correction is within the range of the numerical values above, the time required for the electron beam correction can be effectively shortened as compared with that in a prior art.

The protective layer BH is a layer formed of at least one type of an oxide film, a nitride film, an oxynitride film, and a carbonized film containing tin (Sn) and tantalum (Ta), for example. Specifically, the protective layer BH is a layer formed to contain at least one type of tin oxide (SnO), tin nitride (SnN), tin oxynitride (SnON), tin carbide (SnC), tantalum oxide (TaO), tantalum nitride (TaN), tantalum oxynitride (TaON), and tantalum carbide (TaC), for example. More specifically, in this embodiment, the protective layer BH may be further contained which has a composition different from that of the absorption film B and covers at least a part of the side surface on which the low reflective portion pattern 5*a* is formed of the absorption film B to protect the side surface of the absorption film B.

In order to realize the above-described multi-stage etching process, it is desirable that the material of the absorption layer A can be subjected to the electron beam correction etching with a gas containing a mixture of the fluorine-based gas and oxygen. Therefore, the material of the absorption layer A is tantalum (Ta), silicon (Si), molybdenum (Mo), titanium (Ti), vanadium (V), cobalt (Co), nickel (Ni), zirconium (Zr), niobium (Nb), or hafnium (Hf), for example. Further, a nitride film, an oxide film, or an oxynitride film of these materials may be used. Further, a material containing one or more elements of the elements above may by acceptable. Specifically, when the material of the absorption layer A is tantalum nitride (TaN), materials having an atomic number ratio between tantalum (Ta) and nitrogen (N) within the range of 20:80 to 50:50 are preferable. When the material of the absorption layer A is tantalum oxide (TaO), materials having an atomic number ratio between tantalum (Ta) and oxygen (O) within the range of 20:80 to 50:50 are preferable. When the material of the absorption layer A is tantalum (Ta), materials having an atomic number ratio of tantalum (Ta) of 100 are preferable.

(Manufacturing Method)

A manufacturing method for the reflective photomask 20 is briefly described below.

First, the low reflective portion pattern 5*a* is formed on the reflective photomask blank 10 described above, and then the absorption film A of the outermost surface layer constituting the low reflective portion 5 is subjected to the electron beam correction etching.

Next, the absorption film B located in a lower layer (capping layer 3 side) of the absorption film A as the outermost surface layer that has been subjected to the electron beam correction is subjected to the electron beam correction etching. At this time, the absorption film B is subjected to the electron beam correction etching such that the side etching amount is 5 nm or less.

Next, the absorption film A located in a lower layer of the absorption film B that has been subjected to the electron beam correction etching is subjected to the electron beam correction etching. At this time, an etching resistant film is formed on the side surface of the absorption film B located in an upper layer of the absorption film A.

Next, the absorption film B is subjected to the electron beam correction etching. At this time, the absorption film B is subjected to the electron beam correction etching such that the side etching amount is 5 nm or less.

Thus, the reflective photomask 20 according to this embodiment, i.e., the reflective photomask 20 that has been subjected to the electron beam correction, is manufactured.

(Modification)

FIG. 4 illustrates the aspect in which the shape of the surface of the absorption film B that has been subjected to the side-etching BS, i.e., the side-etched surface, is tilted at a constant ratio from the surface side of the low reflective portion 5 (absorption film B) toward the capping layer 3 side but the present invention is not limited thereto.

Figure 7A:
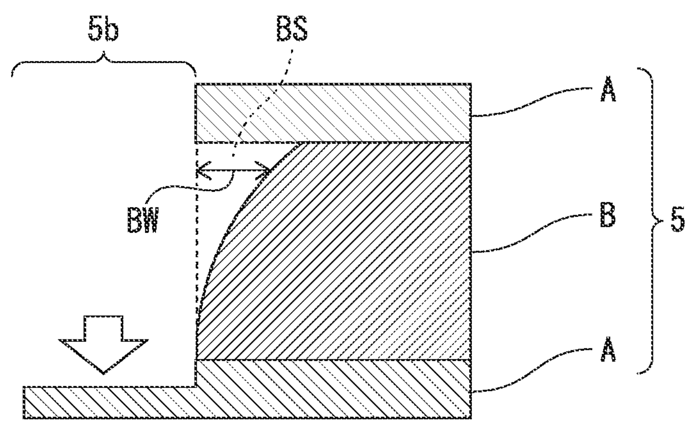
FIG. 7 is schematic cross-sectional view illustrating a modification of side etching after the electron beam correction etching of the multi-layer absorption film of the reflective photomask according to the embodiment of the present invention.
Figure 7B:
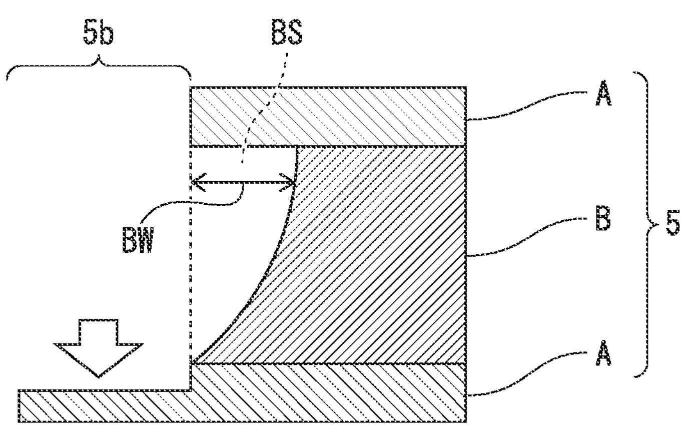
Figure 7C:
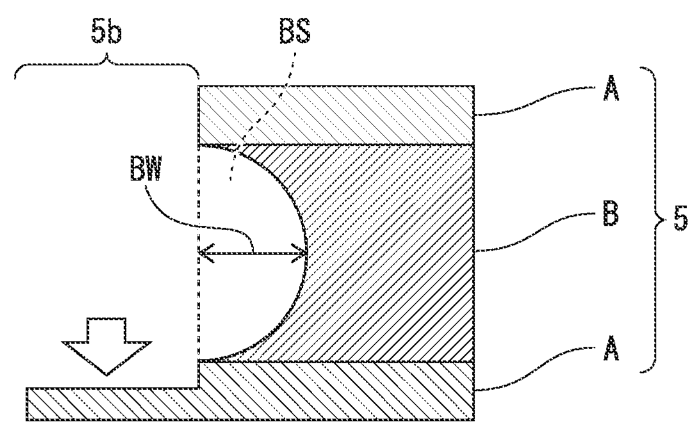

As illustrated in FIGS. 7A to 7C, the shape of the side etched surface may be a curved shape, for example. The side etching amount (width of the side etching BS) BW may be the largest on the upper surface side of the absorption film B as illustrated in FIGS. 7A and 7B or may be the largest in a central part of the absorption film B as illustrated in FIG. 7C, for example. In FIGS. 7A to 7C, the illustration of the protective layer BH is omitted.

Example 1

Hereinafter, Examples of the reflective photomask blank and the reflective photomask according to the present invention are described with reference to the drawings and tables.

First, a method for producing a reflective photomask blank 100 is described with reference to FIG. 8.

Figure 8:
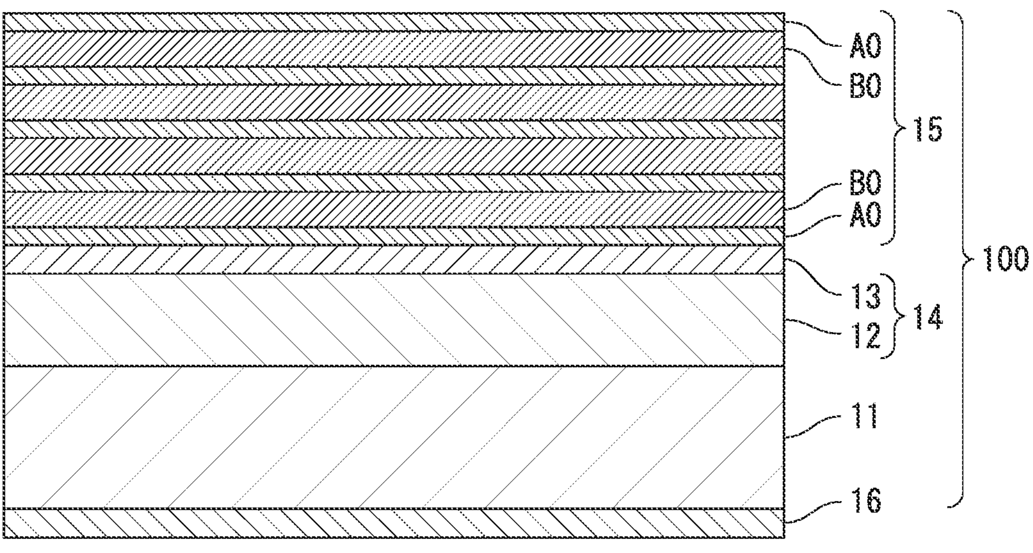
FIG. 8 is a schematic cross-sectional view illustrating the structure of a reflective photomask blank according to Examples of the present invention.

First, as illustrated in FIG. 8, a multi-layer reflective film 12 was formed which was formed by depositing 40 multi-layer films containing a pair of silicon (Si) and molybdenum (Mo) on a synthetic quartz substrate 11 having a low thermal expansion property. The film thickness of the multi-layer reflective film 12 was set to 280 nm. In FIG. 8, the multi-layer reflective film 12 is illustrated by several pairs of multi-layer films, for convenience.

Next, a capping layer 13 formed of ruthenium (Ru) as an intermediate film was formed on the multi-layer reflective film 12 such that the film thickness was 2.5 nm. Thus, a reflective portion 14 having the multi-layer reflective film 12 and the capping layer 13 was formed on the substrate 11.

Next, an absorption layer AO formed of tantalum nitride (TaN) was formed on the capping layer 13 such that the film thickness was 2 nm. The atomic number ratio between tantalum (Ta) and nitrogen (N) was 50:50 as measured by XPS (X-ray photoelectron spectroscopy).

Next, an absorption layer BO formed of tin oxide (SnO) was formed on the absorption layer AO such that the film thickness was 6 nm. The atomic number ratio between tin (Sn) and oxygen (O) was 50:50 as measured by XPS (X-ray photoelectron spectroscopy). The absorption layer BO was found to be amorphous as measured by XRD (X-ray diffractometer), although crystallinity was slightly observed. The absorption layer AO and the absorption layer BO were alternately deposited to form a low reflective portion 15 containing 9 layers in total, consisting of 5 absorption layers AO and 4 absorption layers BO. Thus, the low reflective portion 15 having the absorption layers AO and the absorption layers BO was formed on the reflective portion 14.

Next, a back surface conductive film 16 formed of chromium nitride (CrN) was formed on the surface on the side on which the multi-layer reflective film 12 was not formed of the substrate 11 with a thickness of 100 nm, thereby producing the reflective photomask blank 100.

For the formation of each film (layer formation) on the substrate 11, a multi-source sputtering apparatus was used. The film thickness of each film was controlled by a sputtering time.

Next, a method for producing a reflective photomask 200 is described with reference to FIGS. 9 to 12.

Figure 9:
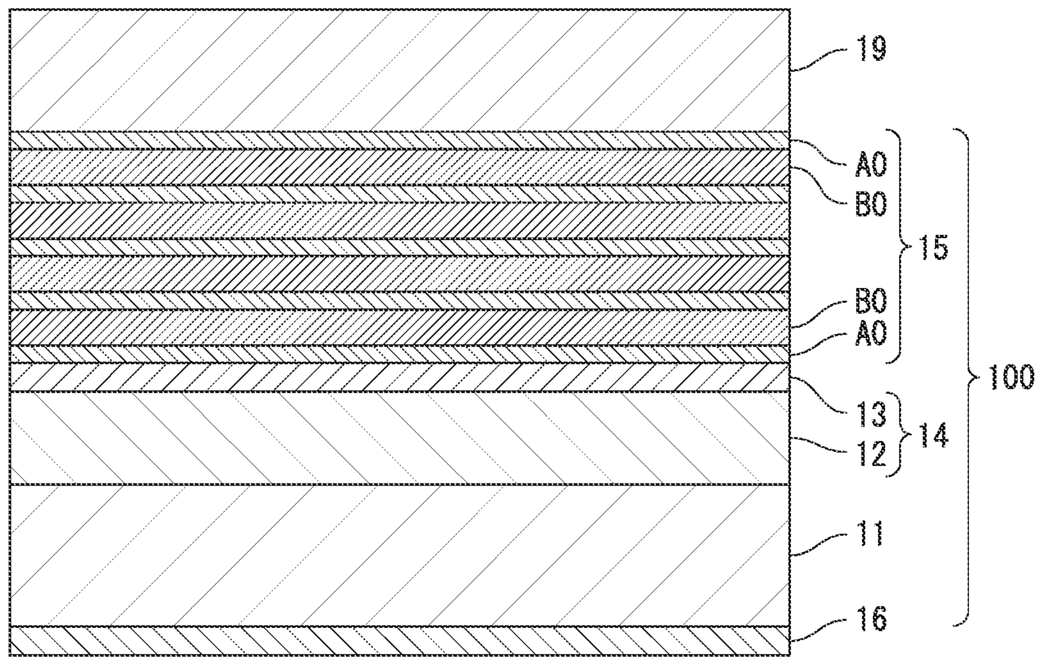
FIG. 9 is a schematic cross-sectional view illustrating a manufacturing step of a reflective photomask according to Examples of the present invention.

First, a positive chemically amplified resist (SEBP9012: manufactured by Shin-Etsu Chemical Co., Ltd.) was formed by spin coating such that the film thickness was 120 nm on the uppermost surface of the low reflective portion 15 included in the reflective photomask blank 100 and baked at 110° C. for 10 minutes to form a resist film 19 as illustrated in FIG. 9.

Figure 10:
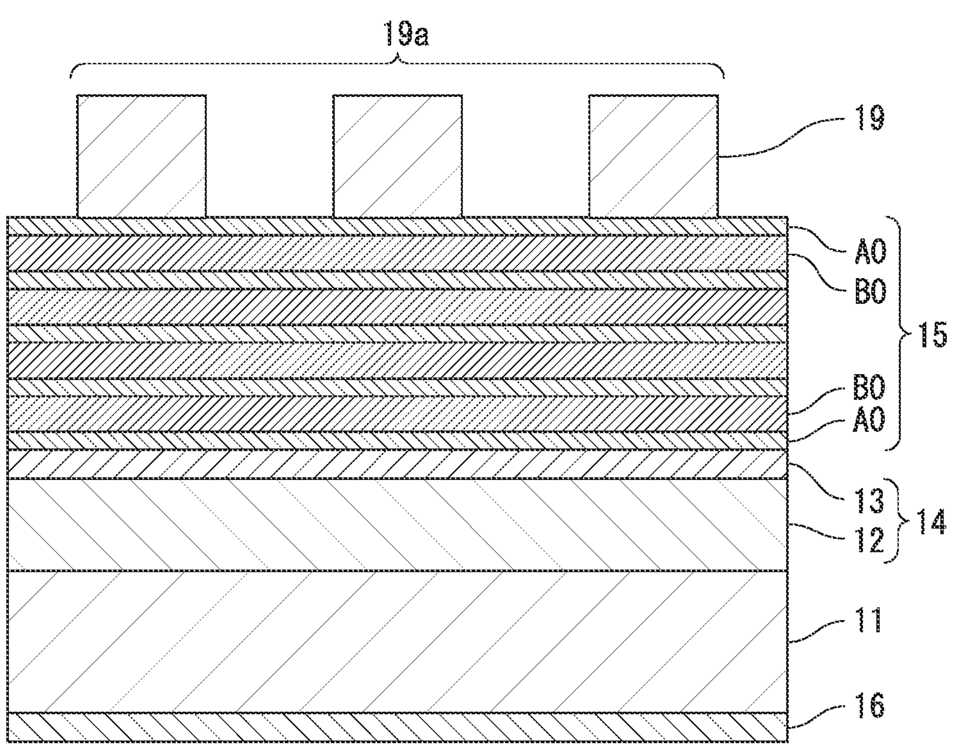
FIG. 10 is a schematic cross-sectional view illustrating a manufacturing step of the reflective photomask according to Examples of the present invention.

Next, a predetermined pattern was drawn on the resist film 19 using an electron beam lithography system (JBX3030: manufactured by JEOL Ltd.). Thereafter, pre-baking treatment was applied at 110° for 10 minutes, and then spray-development was performed using a spray-development machine (SFG3000: manufactured by SIGMAMELTEC LTD.). Thus, a resist pattern 19*a* was formed as illustrated in FIG. 10.

Figure 11:
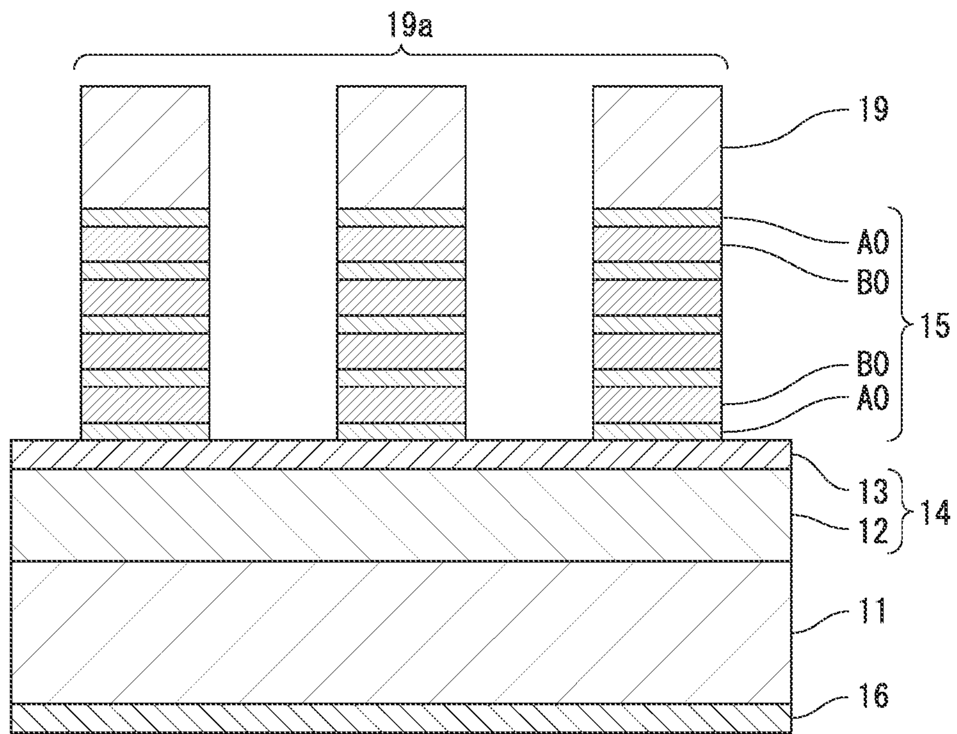
FIG. 11 is a schematic cross-sectional view illustrating a manufacturing step of the reflective photomask according to Examples of the present invention.

Next, the low reflective portion 15 was patterned by dry etching mainly containing a mixed gas of a chlorine gas and a fluorine gas using the resist pattern 19*a* as an etching mask, thereby forming an absorption layer pattern (low reflective portion pattern) as illustrated in FIG. 11.

Figure 12:
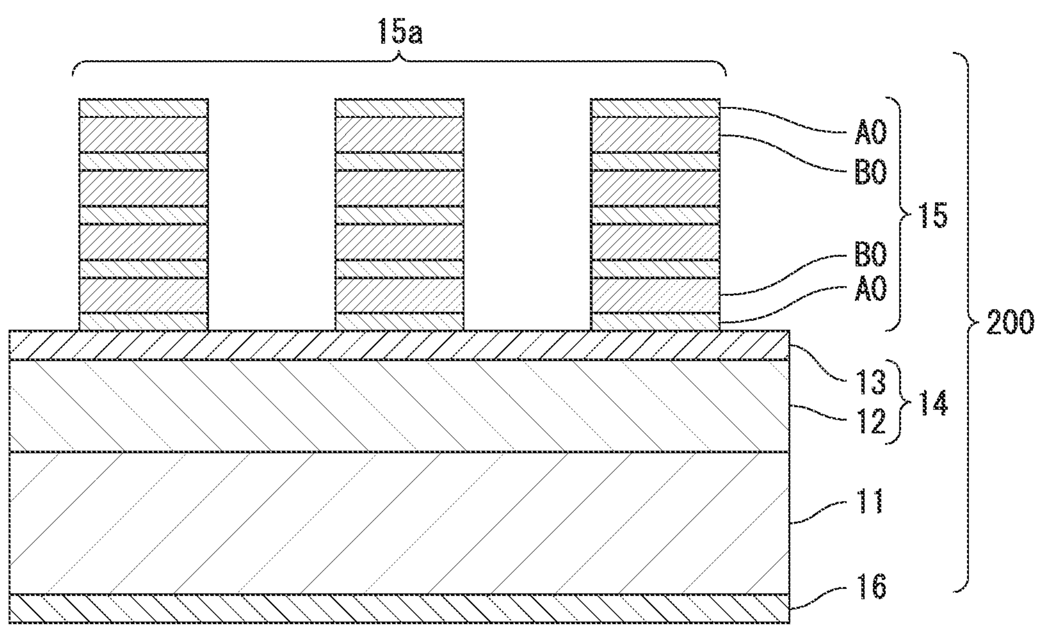
FIG. 12 is a schematic cross-sectional view illustrating a manufacturing step of the reflective photomask according to Examples of the present invention.

Next, a low reflective portion pattern 15*a* was formed by peeling off the remaining resist pattern 19*a*, thereby producing the reflective photomask 200 of this example as illustrated in FIG. 12.

(Correction Method)

Next, an electron beam correction method for the reflective photomask 200 is described with reference to FIGS. 13 to 16.

Figure 13A:
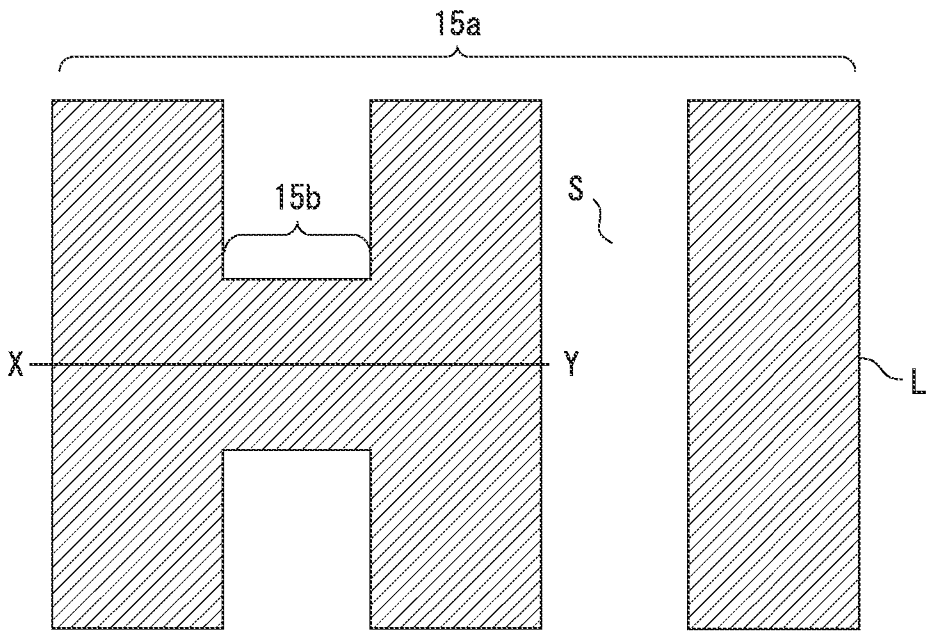
FIG. 13A is a schematic plan view illustrating the structure before a correction step of the reflective photomask according to Examples of the present invention and FIG. 13B is a schematic cross-sectional view thereof.
Figure 13B:
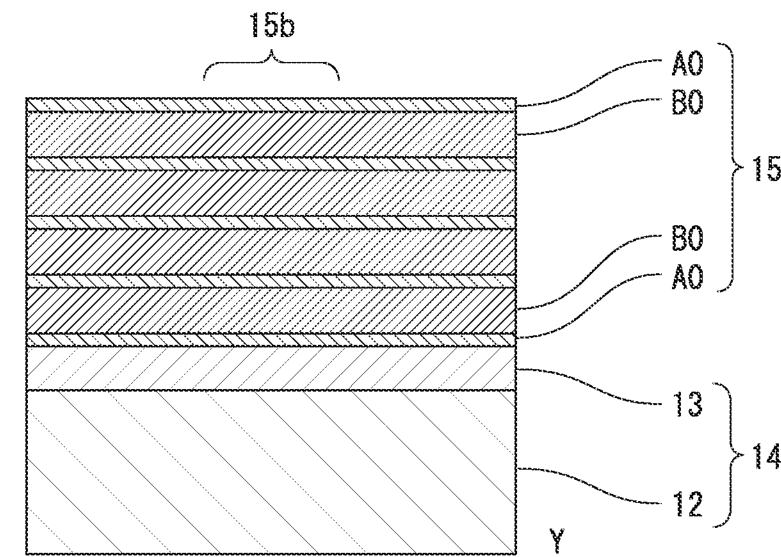

FIG. 13 illustrates an enlarged view of a part of the multi-layer absorption film (low reflective portion 15) in the reflective photomask 200. More specifically, FIG. 13A is a schematic plan view illustrating the structure before a correction step of the reflective photomask 200 according to this example and FIG. 13B is a schematic plan view illustrating the structure before the correction step of the reflective photomask 200 according to this example.

Hereinafter, a specific technique is described which includes applying the electron beam correction etching to the low reflective portion pattern 15*a* formed by dry etching using the resist pattern 19*a*. In FIG. 13A, "L" indicates a region where the low reflective portion 15 was formed and "S" indicates a region where the reflective portion 14 was exposed.

Figure 14:
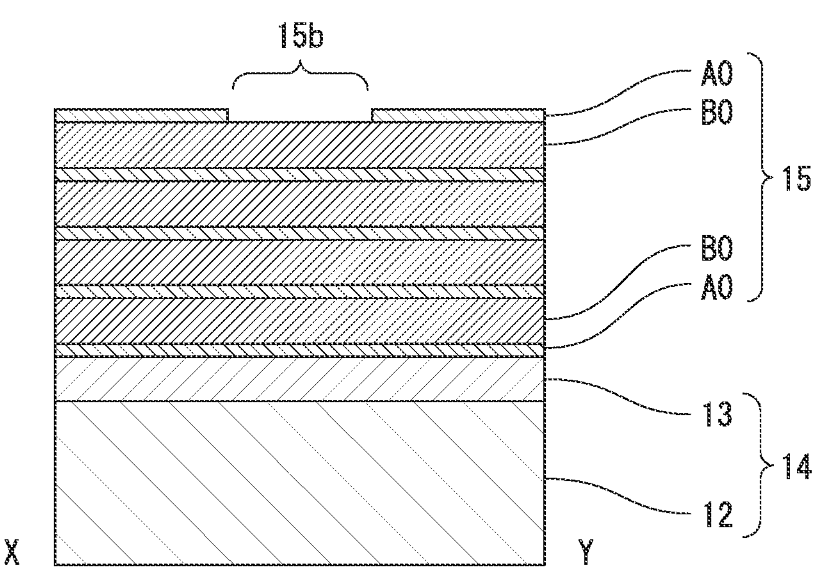
FIG. 14 is a schematic cross-sectional view illustrating the correction step of the reflective photomask according to Examples of the present invention.

First, as illustrated in FIG. 14, the absorption layer AO as the outermost surface layer was irradiated with an electron beam in a gas atmosphere containing a mixture of a fluorine-based gas and oxygen to be subjected to the electron beam correction etching using an electron beam correction system (MeRiT MG45: manufactured by CarlZeiss). For the fluorine gas flow rate at this time, a cold trap technology was used in which the flow rate was controlled by temperatures. In this example, the temperature of fluorine was set to −26° C. (hereinafter referred to as a control temperature) and the temperature of oxygen was set to −43° C.

Figure 15:
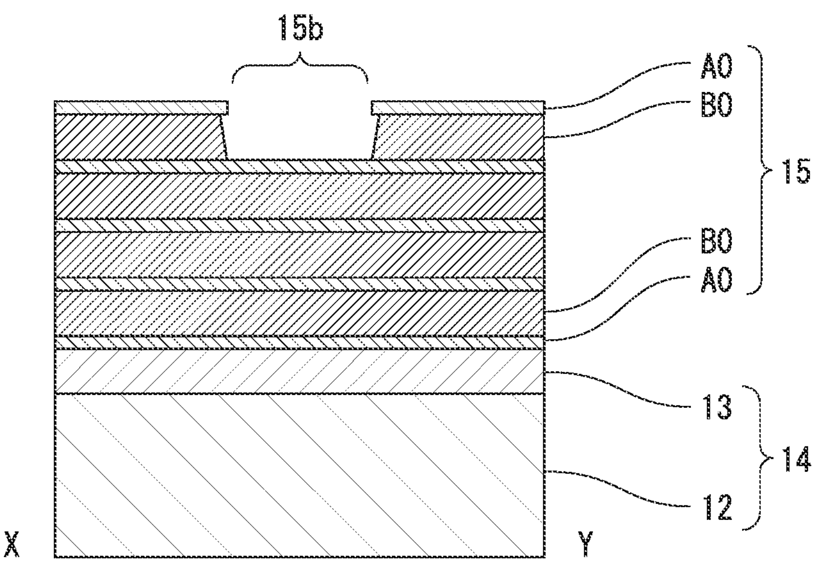
FIG. 15 is a schematic cross-sectional view illustrating the correction step of the reflective photomask according to Examples of the present invention.
Figure 16A:
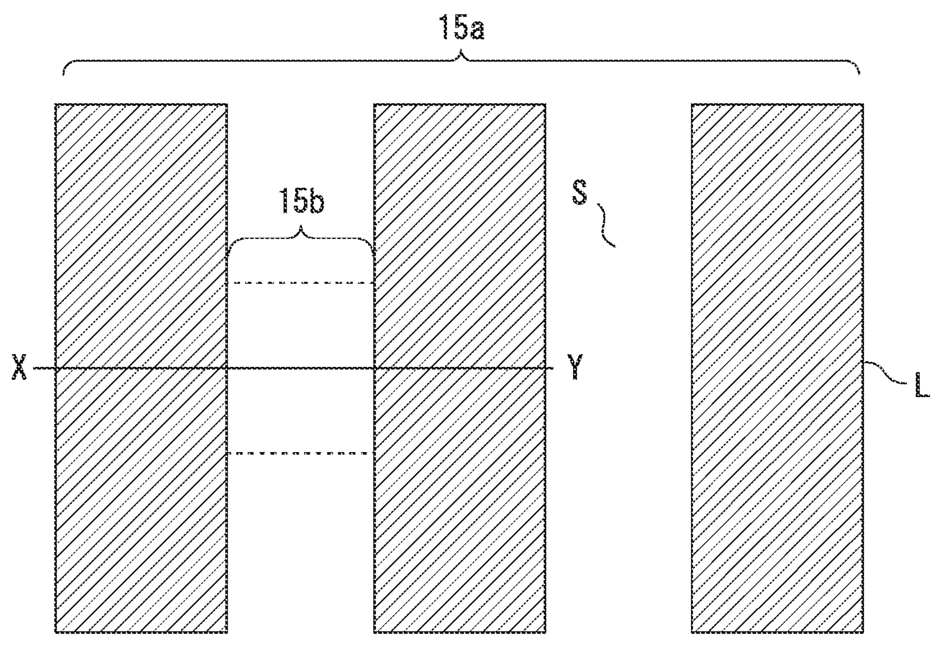
FIG. 16A is a schematic plan view illustrating the structure after the correction step of the reflective photomask according to Examples of the present invention and FIG. 16B is a schematic cross-sectional view thereof.
Figure 16B:
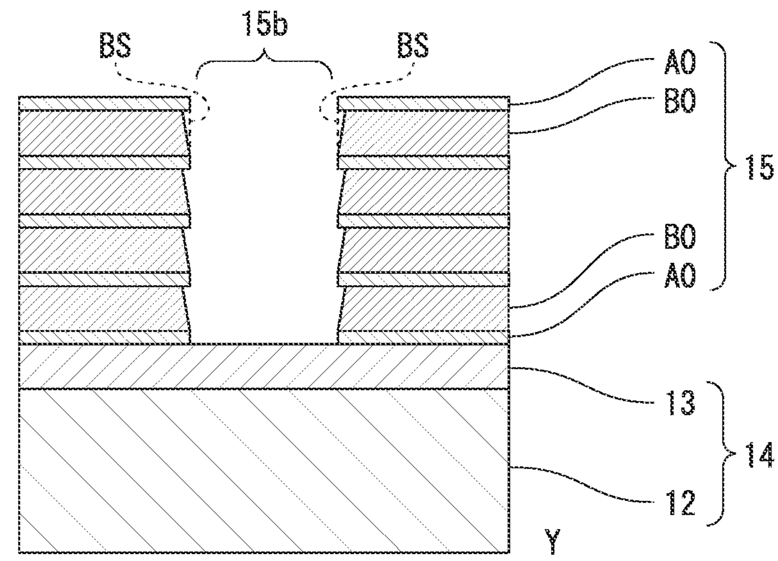

Subsequently, the electron beam correction etching was applied to the absorption layer BO, which is the second layer from the outermost surface layer, by setting the control temperature to 0° C. and irradiating the same with an electron beam in a fluorine-based gas atmosphere using the same device as illustrated in FIG. 15. By repeating the above-described steps, the reflective photomask 200 was obtained in which all the absorption layers were subjected to the electron beam correction etching as illustrated in FIG. 16. The side-etching BS amount (side-etching amount BW) at that time was confirmed to be less than 1 nm by measuring the line width with SEM (LWM9045: manufactured by ADVANTEST CORPORATION).

Example 2

The absorption layer AO was formed with tantalum oxide (TaO) such that the film thickness was 2 nm. The atomic number ratio between tantalum (Ta) and oxygen (O) was 50:50 as measured by XPS (X-ray photoelectron spectroscopy).

Next, the absorption layer BO formed of indium oxide (InO) was formed on the absorption layer AO such that the film thickness was 5 nm. The atomic number ratio between indium (In) and oxygen (O) was 70:30 as measured by XPS (X-ray photoelectron spectroscopy).

The other film formation methods and the mask manufacturing method were the same as those in Example 1. Thus, the reflective photomask 200 of Example 2 was manufactured.

In the electron beam correction etching, it was confirmed that the side etching BS amount (side etching amount BW) was less than 1 nm by setting the control temperature of the fluorine gas flow rate in the electron beam correction of the absorption film AO formed of tantalum oxide (TaO) to −20° C. and setting the control temperature of the fluorine gas flow rate in the electron beam correction of the absorption layer BO formed of indium oxide (InO) to 0° C.

Example 3

The absorption layer AO was formed with tantalum (Ta) such that the film thickness was 2 nm.

Next, the absorption layer BO formed of tantalum tin oxide (SnOTa) was formed on the absorption layer AO such that the film thickness was 8 nm. The atomic number ratio of tin (Sn), tantalum (Ta), and oxygen (O) was 40:40:20 as measured by XPS (X-ray photoelectron spectroscopy).

The other film formation methods and the mask manufacturing method were the same as those in Example 1.

Thus, the reflective photomask 200 of Example 3 was manufactured.

In the electron beam correction etching, it was confirmed that the side etching BS amount (side etching amount BW) was less than 2 nm by setting the control temperature of the fluorine gas flow rate in the electron beam correction of the absorption film AO formed of tantalum (Ta) to −15° C. and setting the control temperature of the fluorine gas flow rate in the electron beam correction of the absorption layer BO formed of tantalum tin oxide (SnOTa) to 0° C.

Comparative Example 1

The reflective photomask 200 of Comparative Example 1 was manufactured in the same manner as in Example 1, except that the absorption layer AO was formed with tantalum nitride (TaN) such that the film thickness was 60 nm and the absorption layer BO was not formed. It was confirmed that the side etching amount BS (side etching amount BW) was less than 1 nm.

Comparative Example 2

The reflective photomask 200 of Comparative Example 2 was manufactured in the same manner as in Example 1, except that the absorption layer BO was formed with tin oxide (SnO) such that the film thickness was 30 nm and the absorption layer AO was not formed. It was confirmed that the side etching amount BS (side etching amount BW) was 15 nm.

The evaluation results of Examples 1 to 3 and Comparative Examples 1 and 2 are shown in Table 1 and Table 2.

In Examples, the side etching amount, the correction etching rate ratio, and the transfer performance were evaluated.

For the side etching amount, a case where the side etching amount is “5 nm” or less has no problems in use, and thus was evaluated as “Pass”.

The correction etching rate ratios shown in Table 1 and Table 2 show the relative electron beam correction etching rate (total etching rate of the low reflective portion 15) when the electron beam correction etching rate of the absorption layers BO according to Comparative Examples 2, i.e., “SnO having an atomic number ratio between tin (Sn) and oxygen (O) of 50:50”, was set to “1”. More specifically, the low reflective portion 15 according to Example 1 can be corrected 30 times faster than the low reflective portion 15 according to Comparative Example 2.

For the correction etching rate ratio, a case where the rate is “20 (times)” or more has no problems in use, and thus was evaluated as “Pass”.

In Table 1 and Table 2, for the transfer performance, a case where the shadowing effect is small and there is no problem with transfer performance in use was marked with “0” and a case where the shadowing effect is not negligible and an improvement of the transfer performance is expected in use was marked with “A”.

As shown in Table 1 and Table 2, even when the material used for the low reflective portion 15 has a large extinction coefficient k to the EUV light, the time required for the electron beam correction etching of the reflective photomask 200 was able to be reduced.

INDUSTRIAL APPLICABILITY

The reflective photomask blank and the reflective photomask according to the present invention can be suitably used to suppress the side etching in the electron beam correction etching.

REFERENCE SIGNS LIST

1 substrate
2 multi-layer reflective film (reflective film)
3 capping layer (protective film)
4 reflective portion
5 low reflective portion (absorption film)
**5*a*** low reflective portion pattern (transfer pattern)
**5*b*** portion subjected to electron beam correction etching in low reflective portion
10 reflective photomask blank (reflective mask blank)
20 reflective photomask (reflective mask)
11 substrate
12 multi-layer reflective film (reflective film)
13 capping layer (protective film)
14 reflective portion
15 low reflective portion (absorption film)
**15*a*** low reflective portion pattern (transfer pattern)
**15*b*** portion subjected to electron beam correction etching in low reflective portion

TABLE 1

| | Ex. 1 | | Ex. 2 | | Ex. 3 | |
|---|---|---|---|---|---|---|
| | Absorption layer AO | Absorption layer BO | Absorption layer AO | Absorption layer BO | Absorption layer AO | Absorption layer BO |
| Composition | TaN | SnO | TaO | InO | Ta | SnOTa |
| Atomic number ratio | Ta = 50<br>N = 50 | Sn = 50<br>O = 50 | Ta = 50<br>O = 50 | In = 70<br>O = 30 | Ta = 100 | Sn = 40<br>O = 40<br>Ta = 20 |
| Total film thickness of low reflective portion (nm) (Absorption layer AO + Absorption layer BO) | 34 | | 30 | | 42 | |
| Side etching amount (nm) | <1 | | <1 | | <2 | |
| Correction etching rate ratio | 30 | | 20 | | 25 | |
| Transfer performance | ○ | | ○ | | ○ | |

TABLE 2

| | Comp. Ex. 1 | | Comp. Ex. 2 | |
|---|---|---|---|---|
| | Absorption layer AO | Absorption layer BO | Absorption layer AO | Absorption layer BO |
| Composition | TaN | — | — | SnO |
| Atomic number ratio | Ta = 50<br>N = 50 | — | — | Sn = 50<br>O = 50 |
| Total film thickness of low reflective portion (nm) (Absorption layer AO + Absorption layer BO) | 60 | | 30 | |
| Side etching amount (nm) | <1 | | 15 | |
| Correction etching rate ratio | 60 | | 1 | |
| Transfer performance | Δ | | ○ | |

16 back surface conductive film
19 resist film
19*a* resist pattern
100 reflective photomask blank (reflective mask blank)
200 reflective photomask (reflective mask)
A absorption layer (first absorption film)
B absorption layer (second absorption film)
BS side etching
BH protective layer (etching resistant film)
AO absorption layer (first absorption film)
AO absorption layer (second absorption film)
BW side etching amount (side etching width)
L region with low reflective portion
S region with exposed reflective portion

The invention claimed is:

1. A reflective mask blank comprising:

a substrate;

a reflective film having a multi-layer film structure formed on the substrate and configured to reflect an EUV light;

a protective film formed on the reflective film and configured to protect the reflective film; and an absorption film comprising a multi-layer film formed on the protective film and configured to absorb the EUV light, wherein the absorption film is obtained by alternately depositing a first absorption film and a second absorption film, such that the first absorption film is in contact with the protective film and an outermost surface layer of the absorption film is the first absorption film, under the presence of an etching gas, a correction etching rate in electron beam correction of the first absorption film is within a range of 20 times or more and 100 times or less a correction etching rate in electron beam correction of the second absorption film, the first absorption film contains one or more elements selected from vanadium, cobalt, nickel, zirconium, niobium, and hafnium, the second absorption film contains one or more elements selected from indium and platinum, the surface roughness Ra of the reflective mask blank is less than 1.0 nm, a total film thickness of the absorption film is 60 nm or less, and a film thickness of the first absorption film is within a range of 0.5 nm or more and 6 nm or less.

2. The reflective mask blank according to claim 1, wherein at least one of the first absorption film or the second absorption film contains one or more types selected from nitrogen, oxygen, and carbon.

3. The reflective mask blank according to claim 1, wherein a film thickness of the second absorption film is 35 nm or less.

4. A reflective mask comprising:

a substrate;

a reflective film having a multi-layer film structure formed on the substrate and configured to reflect an EUV light;

a protective film formed on the reflective film and configured to protect the reflective film; and an absorption film comprising a multi-layer film formed on the protective film and configured to absorb the EUV light, wherein a transfer pattern is formed on the absorption film, the absorption film is formed by alternately depositing a first absorption film and a second absorption film, such that the first absorption film is in contact with the protective film and an outermost surface layer of the absorption film is the first absorption film, under the presence of an etching gas, a correction etching rate in electron beam correction of the first absorption film is within a range of 20 times or more and 100 times or less a correction etching rate in electron beam correction of the second absorption film, the first absorption film contains one or more elements selected from vanadium, cobalt, nickel, zirconium, niobium, and hafnium, the second absorption film contains one or more elements selected from indium and platinum, the surface roughness Ra of the reflective mask is less than 1.0 nm, a total film thickness of the absorption film is 60 nm or less, and a film thickness of the first absorption film is within a range of 0.5 nm or more and 6 nm or less.

5. The reflective mask according to claim 4, wherein at least one of the first absorption film or the second absorption film contains one or more types selected from nitrogen, oxygen, and carbon.

6. The reflective mask according to claim 4, wherein a film thickness of the second absorption film is 35 nm or less.

7. The reflective mask according to claim 4, comprising:

a projection portion and a depressed portion on a side surface on which the transfer pattern is formed of the second absorption film, the projection portion being a most projecting portion in an in-plane direction of the second absorption film and the depressed portion being a most depressed portion in the in-plane direction of the second absorption film, wherein when a distance from the projection portion to the depressed portion in the in-plane direction of the second absorption film is defined as a side etching amount, the side etching amount is 5 nm or less.

8. The reflective mask according to claim 4, further comprising:

an etching resistant film having a composition different from a composition of the second absorption film and configured to cover at least a part of a side surface on which the transfer pattern is formed of the second absorption film to protect the side surface of the second absorption film.

9. A method for manufacturing the reflective mask according to claim 4, the method comprising:

performing electron beam correction etching of the first absorption film; and performing electron beam correction etching of the second absorption film, wherein in the performing of the electron beam correction etching of the first absorption film, an etching resistant film is formed on a side surface of the second absorption film when the first absorption film is subjected to the electron beam correction etching, and in the performing of the electron beam correction etching of the second absorption film, the second absorption film is subjected to the electron beam correction etching such that a side etching amount is 5 nm or less.

10. A correction method by electron beam correction etching of the reflective mask according to claim 4 comprising:

performing electron beam correction of the first absorption film with an oxygen-containing etching gas; and performing electron beam correction of the second absorption film with an oxygen-free etching gas.

* * * * *